United States Patent [19]

Horan

[11] 4,296,340
[45] Oct. 20, 1981

[54] INITIALIZING CIRCUIT FOR MOS INTEGRATED CIRCUITS

[75] Inventor: Douglas F. Horan, Los Gatos, Calif.

[73] Assignee: Intel Corporation, Santa Clara, Calif.

[21] Appl. No.: 70,133

[22] Filed: Aug. 27, 1979

[51] Int. Cl.³ .............. H03K 17/284; H03K 17/22; H03K 17/16; H03K 5/08
[52] U.S. Cl. .................. 307/550; 307/238.3; 307/279; 307/594
[58] Field of Search .............. 307/200 B, 279, 238.2, 307/238.3, 443, 542, 549, 550, 594; 365/95, 206, 226, 228

[56] References Cited

U.S. PATENT DOCUMENTS

| | | | |
|---|---|---|---|
| 3,753,011 | 8/1973 | Faggin | 307/238.3 X |
| 3,895,239 | 7/1975 | Alaspa | 307/594 |
| 3,950,654 | 4/1976 | Broedner et al. | 307/DIG. 1 X |
| 3,983,420 | 9/1976 | Kikuchi | 307/279 |
| 4,013,902 | 3/1977 | Payne | 307/594 |
| 4,085,458 | 4/1978 | Ikuzaki et al. | 365/206 |
| 4,103,187 | 7/1978 | Imamura | 307/200 B X |
| 4,208,595 | 6/1980 | Gladstein et al. | 307/200 B X |
| 4,210,829 | 7/1980 | Wong et al. | 307/550 X |

Primary Examiner—Larry N. Anagnos
Attorney, Agent, or Firm—Blakely, Sokoloff, Taylor & Zafman

[57] ABSTRACT

An initializing circuit and protection circuit for MOS integrated circuits which employ substrate biasing are disclosed. In one embodiment, a weak depletion mode transistor is coupled between a line in the integrated circuit and ground. The gate of this transistor receives the substrate biasing potential. Since this transistor is enabled without power applied to the circuit, when the circuit is powered-up, this transistor effectively shorts-out the line and prevents the transmission of stray signals. When the substrate biasing potential is reached, the transistor is disabled and effectively removed from the circuit. Once this occurs, normal transmissions on the line are possible.

10 Claims, 2 Drawing Figures

INITIALIZING CIRCUIT FOR MOS INTEGRATED CIRCUITS

BACKGROUND OF THE INVENTION

1. Field of the Invention

The invention relates to the field of MOS protection and initialization circuits.

2. Prior Art

In integrated circuits, such as MOS circuits, transients often occur when power is applied. Some of these transients, particularly in a system using many integrated circuits, can place the system in an undesirable status, provide false readings or cause countless other problems. To prevent this, numerous prior art circuits are used. For example, bi-stable circuits (flip-flops) are frequently employed. The output of these bi-stable circuits are used to control, among other circuits, the tri-state output of a buffer. The bi-stable circuit prevents transient outputs from the buffer until the bi-stable circuit is re-set. Then the buffer operates normally.

These prior art circuits have the disadvantage of requiring power to operate and, thus, there is always a delay associated with, for example, disabling an output buffer, or other circuit.

As will be seen, the present invention discloses a protection circuit, which may be used on output buffers or in other applications, which effectively operates with no power applied.

SUMMARY OF THE INVENTION

A protection circuit is described which is useful in an MOS integrated circuit employing substrate biasing. The protection circuit prevents the transmission of signals, such as noise signals, on a line in the integrated circuit when the circuit is initially powered-up. A transistor is coupled to the integrated circuit line to prevent the transmission of signals when the transistor is enabled. The gate of the transistor is coupled to receive the substrate biasing potential. The threshold voltage of the transistor is such that the transistor is enabled in the absence of substrate biasing potential and is disabled by the substrate biasing potential. Thus, during the period when the integrated circuit is initially powered-up, the stray signals, etc. are prevented from being transmitted. However, once the substrate biasing potential is reached, the transistor is disabled and effectively removed from the circuit, and thus does not then disturb the transmission of signals on the line.

DETAIL DESCRIPTION OF THE INVENTION

Figure 1:
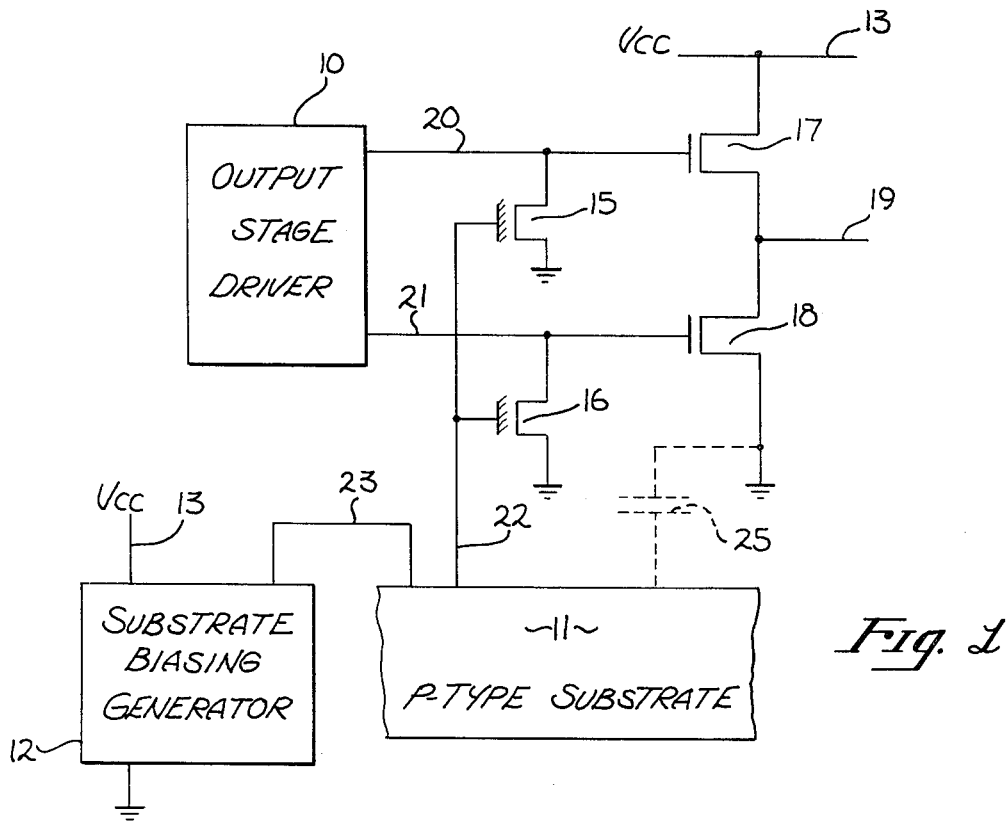
FIG. 1 is a circuit diagram of one embodiment of the invention where the protection circuit is employed as part of an output buffer.

A protection circuit and initialization circuit particularly suitable for use in metal-oxide-semiconductor (MOS) integrated circuits where substrate biasing is employed is described. In the following description, numerous specific details, such as conductivity types, etc., are set forth to provide a thorough understanding of the present invention. However, it will be apparent to one skilled in the art that the present invention may be practiced without these specific details. In other instances, well known circuits have been shown in block diagram form and well-known fabrication techniques have not been described, in order not to obscure the present invention in unnecessary detail.

The MOS integrated circuits in which the present preferred embodiment of the invention is used is fabricated employing a plurality of field-effect transistors. A number of different transistor-types are employed; each of these types has a different threshold voltage. The specific process employed for obtaining the different transistor types is disclosed in U.S. Pat. No. 4,052,229. This process employs a high resistivity P-type silicon substrate (50 ohm-cm) which results in high mobility devices with low body effect.

One transistor type employed in the circuit is an enhancement mode transistor having a threshold voltage of approximately 0.6 to 0.9 volts. This transistor is illustrated in the drawings by the standard field-effect transistor symbol, such as transistors 17 and 18 of FIG. 1. The second transistor type employed is a depletion mode transistor having a threshold voltage of approximately $-2.5$ volts to $-3.0$ volts. The symbol designation used in the drawings for this transistor type is shown by transistor 32 of FIG. 2. A second depletion mode transistor (a weak depletion mode transistor) having a threshold voltage of between $-1.2$ to $-1.8$ volts is also employed. The transistor symbol for this device is shown by transistors 15 and 16 of FIG. 1. This weak depletion mode device has lower conductance than the first-mentioned depletion mode transistor. Another transistor type having approximately a zero threshold voltage, which results from the above-mentioned process, is not used in the circuits of FIGS. 1 and 2.

The portion of an integrated circuit shown in FIG. 1 is fabricated on a P-substrate 11 in the presently preferred embodiment. As is frequently the case for MOS integrated circuits, the substrate is biased. For n-channel devices where $V_{cc}$ is equal to 5 volts, substrate biasing of approximately $-3$ volts is sometimes employed. The substrate biasing is often generated on-chip with a generator shown as generator 12. Well-known circuits, for example, those employing charge-pumping techniques, are used to develop this substrate potential. As is well-known, this potential enhances performance in many MOS circuits.

In FIG. 1, the portion of the integrated circuit shown includes an output stage driver 10. This stage provides complementary output signals on lines 20 and 21 for driving a push-pull output stage comprising the enhancement mode transistor 17 and 18, which are coupled in series between line 13 and ground. An output signal from the integrated circuit is provided on line 19.

In typical operation, when $V_{cc}$ is applied to line 13, stray signals occur on lines 20 or 21, causing output signals on line 19. (It is these spurious signals which are eliminated by the present invention). These transient-like signals occur before the circuit is fully powered-up. For example, until the substrate biasing potential is reached, the circuit may not be stabilized and transients will continue to occur. Generally, the substrate biasing potential climbs somewhat slowly when compared to the $V_{cc}$ potential. This occurs because the on-chip generator is often small and there is substantial parasitic capacitance shown by capacitance 25 which must be charged from line 23 before the full substrate biasing potential is reached. In a typical case, the parasitic capacitance may be 100 pF, and the biasing potential may lag $V_{cc}$ by approximately 100 μS.

With the present invention, a pair of weak depletion mode transistors 15 and 16 have their drain terminals coupled to lines 20 and 21, respectively. The source terminals of these transistors are coupled to ground. The gates of these transistors are coupled via line 22 to a source of the substrate biasing potential.

In operation assume that $V_{cc}$ is applied to the integrated circuit of FIG. 1. With the present invention, transistors 15 and 16 are enabled even before power is applied to the circuit. (A characteristic of depletion mode transistors is that they conduct without a potential applied to their gates). Thus, when the circuit is powered-up, transistors 15 and 16 are conducting and provide a path to ground for any signals on lines 20 and 21. This prevents signals from occurring on line 19. As the substrate biasing potential increases, transistors 15 and 16 are disabled. That is, when the potential on line 22 exceeds approximately −1.8 volts, these transistors are cutoff and are effectively removed from the circuit. When this occurs, transistors 17 and 18 are totally under the control of the output stage driver 10. At this time, the driver 10 will be in some predetermined, stable, condition so as to prevent undesirable signals from being generated on line 19.

Thus, through the use of weak depletion mode transistors on lines 20 and 21, stray signals are prevented from being transmitted along these lines. Unlike prior art protection circuits, transistors 15 and 16 require no power to perform their function since they are enabled without a potential applied to their gates.

It will be obvious to one skilled in the art that depletion mode transistors may be used on many different circuits (other than the output buffer of FIG. 1) to accomplish the same result.

In many integrated circuits, it is necessary to have a signal generated on the chip once all the power supply potentials, including the substrate biasing potential, have reached a predetermined level. This initializing signal is used to set or re-set bi-stable circuits and a host of other functions.

Figure 2:
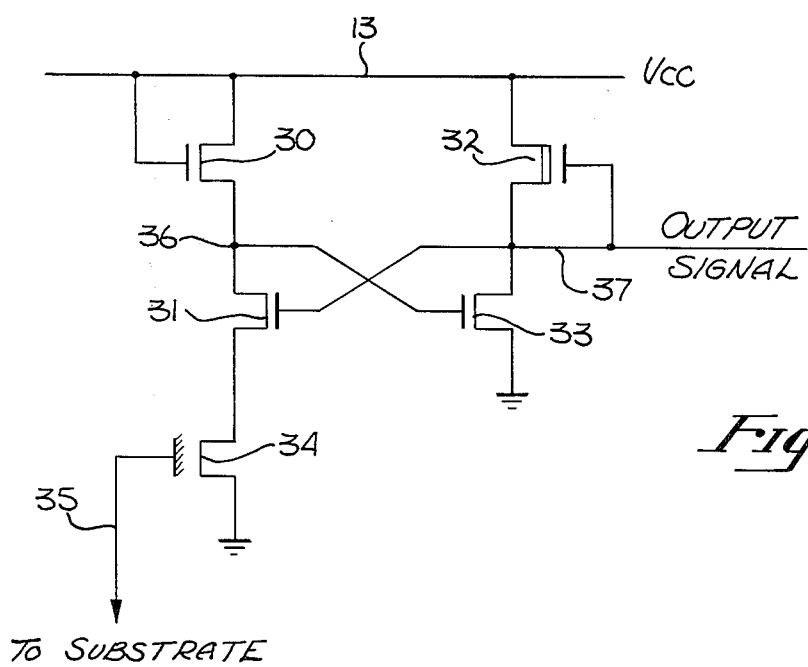
FIG. 2 is a schematic of another embodiment of the present invention which provides an initializing signal once the substrate potential reaches a predetermined level.

The circuit of FIG. 2, which provides this signal, includes in its presently preferred embodiment a pair of cross-coupled transistors 31 and 33, which are coupled to $V_{cc}$ through a pair of load devices. The load for transistor 33 comprises a depletion mode transistor 32 having its gate coupled to the output line (node 37). The load for the enhancement mode transistor 31 consists of an enhancement mode transistor 30 coupled between the drain of transistor 31 (node 36) and line 13.

A weak depletion mode transistor 34 is coupled between the source terminal of transistor 31 and ground. The gate of this transistor is coupled to receive the substrate biasing potential through line 35. Again, as in the case of FIG. 1, it is assumed that once the substrate biasing potential reaches a predetermined level, transistor 34 will be disabled.

Assume that power is initially applied to the integrated circuit of FIG. 2, specifically that the $V_{cc}$ potential is applied to line 13. Node 37 begins to rise since transistor 32 is conducting. Note that node 36 does not immediately rise since transistor 30 will not conduct until $V_{cc}$ reaches the threshold voltage of transistor 30. As the potential on node 37 rises, transistor 31 begins to conduct, coupling node 36 to ground. When power is applied, transistor 34 is conducting since the substrate biasing potential generally climbs more slowly than the $V_{cc}$. Thus, initially, node 37 reaches $V_{cc}$ while node 31 is brought towards zero potential.

Transistor 34 acts a reset device for the circuit. As long as the substrate biasing voltage is above (in the positive sense) the threshold voltage of transistor 34, this transistor continues to conduct. When the substrate generator has had sufficient time to charge the substrate, transistor 34 ceases to conduct and node 36 begins to rise in potential. When node 36 reaches the threshold voltage of transistor 33, transistor 33 conducts discharging node 37, thereby providing an output signal (initializing signal) at node 37. When this occurs, the bi-stable circuit is reset in a state with node 36 high and node 37 low. The circuit will remain in this condition until the circuit is de-activated. The circuit is particularly immune to $V_{cc}$ changes and thus the state of the bi-stable circuit will not be changed by variations in $V_{cc}$ potential.

Variations in the circuit of FIG. 2 will be apparent to one skilled in the art. For example, a depletion mode transistor may be employed as a resistance means instead of the enhancement mode transistor 30.

Thus, a protection circuit and initialization circuit have been disclosed which employ the substrate biasing potential to disable a weak depletion mode transistor. This transistor is used to prevent the transmission of unwanted signals or to provide an initializing signal once the substrate potential has reached a predetermined level.

I claim:

1. In an MOS integrated circuit employing a substrate biasing potential, a protection circuit for initially preventing the transmission of signals on a line in said integrated circuit when power is applied to said integrated circuit, comprising:

a transistor coupled to said line for preventing said transmission of said signals when said transistor is enabled, the gate of said transistor being coupled to receive said substrate biasing potential;

the threshold voltage of said transistor being selected such that said transistor is enabled in the absence of said substrate biasing potential and said transistor is disabled when said substrate biasing potential reaches a predetermined level;

whereby prior to and during the period when said integrated circuit is initially powered, said signals are prevented from being transmitted.

2. The protection circuit defined by claim 1 wherein said transistor is a depletion mode transistor.

3. The protection circuit defined by claim 2 wherein said transistor is coupled between said line and ground potential.

4. In an MOS integrated circuit employing an onchip substrate biasing generator which provides a substrate biasing potential, a protection circuit for preventing the transmission of signals on a line in said integrated circuit when said integrated circuit is initially powered, comprising:

a depletion mode transistor coupled to said line for preventing said transmission of said signals when said transistor is enabled, the gate of said transistor being coupled to receive said substrate biasing potential;

the threshold voltage of said transistor being selected such that said transistor is disabled by said substrate biasing potential when said potential reaches a predetermined level;

whereby prior to and during the period when said integrated circuit is initially powered, said signals are prevented from being transmitted.

5. The protection circuit defined by claim 4 wherein said transistor is coupled between said line and ground potential.

6. In an MOS integrated circuit employing an onchip substrate biasing generator which provides a substrate biasing potential, a protection circuit for preventing the transmission of signals on a line in said integrated circuit when said integrated circuit is initially powered, comprising:

a depletion mode transistor having its drain terminal coupled to said line and its source terminal coupled to ground potential, said transistor for providing a path to ground for said signals when said transistor is enabled, the gate of said transistor being coupled to receive said substrate biasing potential;

the threshold voltage of said transistor being such that said transistor is disabled by said substrate biasing potential when said potential reaches a predetermined level;

whereby during the period when said integrated circuit is initially powered, said signals are prevented from being transmitted.

7. In an MOS integrated circuit employing a substrate biasing generator for providing a substrate biasing potential, an initializing circuit for providing an initializing signal once said substrate biasing potential has reached a predetermined level comprising:

a pair of cross-coupled field-effect transistors;

a pair of resistance means for providing loads for said cross-coupled field-effect transistors, one of said resistance means coupled to the drain terminals of one of said cross-coupled transistors and the other of said resistance means coupled to the drain terminal of the other of said cross-coupled transistors;

a depletion mode transistor coupled between the source terminal of one of said cross-coupled transistors and ground potential, the gate of said depletion mode transistor being coupled to receive said substrate biasing potential;

said initializing signal being provided from one of said resistance means;

whereby when said substrate biasing potential reaches said predetermined potential, said depletion mode transistor is disabled, providing said initializing signal.

8. The initializing circuit defined by claim 7 wherein at least one of said resistance means is a depletion mode transistor.

9. The initializing circuit defined by claim 7 wherein the threshold voltage of said depletion mode transistor is such that said transistor is disabled when said substrate biasing potential reaches a predetermined level.

10. The initializing circuit defined by claim 9 wherein said transistors are n-channel devices.

* * * * *